(12) United States Patent
Sinclair

(10) Patent No.: US 7,090,522 B2
(45) Date of Patent: Aug. 15, 2006

(54) TOP LOADED BURN-IN SOCKET

(75) Inventor: William Y. Sinclair, Frenchtown, NJ (US)

(73) Assignee: Aries Electronics, Inc., Frenchtown, NJ (US)

( * ) Notice: Subject to any disclaimer, the term of this patent is extended or adjusted under 35 U.S.C. 154(b) by 0 days.

(21) Appl. No.: 11/210,322

(22) Filed: Aug. 24, 2005

(65) Prior Publication Data
US 2006/0046531 A1    Mar. 2, 2006

Related U.S. Application Data

(60) Provisional application No. 60/605,321, filed on Aug. 27, 2004.

(51) Int. Cl.
*H01R 11/22* (2006.01)
(52) U.S. Cl. .................................................... 439/266
(58) Field of Classification Search ................ 439/266, 439/268, 264, 263
See application file for complete search history.

(56) References Cited

U.S. PATENT DOCUMENTS 5,611,705 A * 3/1997 Pfaff .......................... 439/266
6,261,114 B1 * 7/2001 Shimada ..................... 439/266
6,350,138 B1 * 2/2002 Atobe et al. ................ 439/266

* cited by examiner

*Primary Examiner*—Javaid H. Nasri
(74) *Attorney, Agent, or Firm*—Anthony J. Casella; Gerald E. Hespos

(57) ABSTRACT

A top loaded burn-in socket for forming a plurality of electrical connections between a ball gird array (BGA) package having a plurality of conductive ball leads and an electrical component is provided. The socket assembly includes a plurality of resilient electrical contacts; a cam being configured to position the contacts from a first position to a second position; a device guide plate including a plurality of openings for receiving the ball leads; and an actuating mechanism configured to interact with the cam to position the contacts, wherein an upper portion of the contacts engages the ball leads between the upper portion and an inclined surface of the device guide plate openings. Each ball is thus held in a manner that does not require the use of a hold down mechanism for effecting electrical continuity between the BGA package and the contacts of the subject burn-in socket.

10 Claims, 10 Drawing Sheets

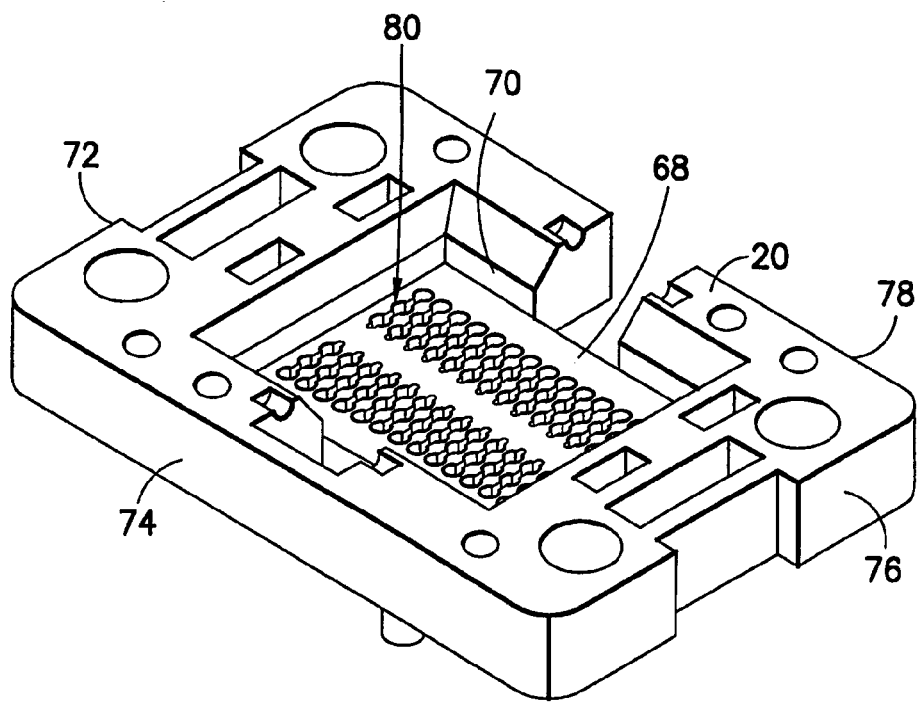
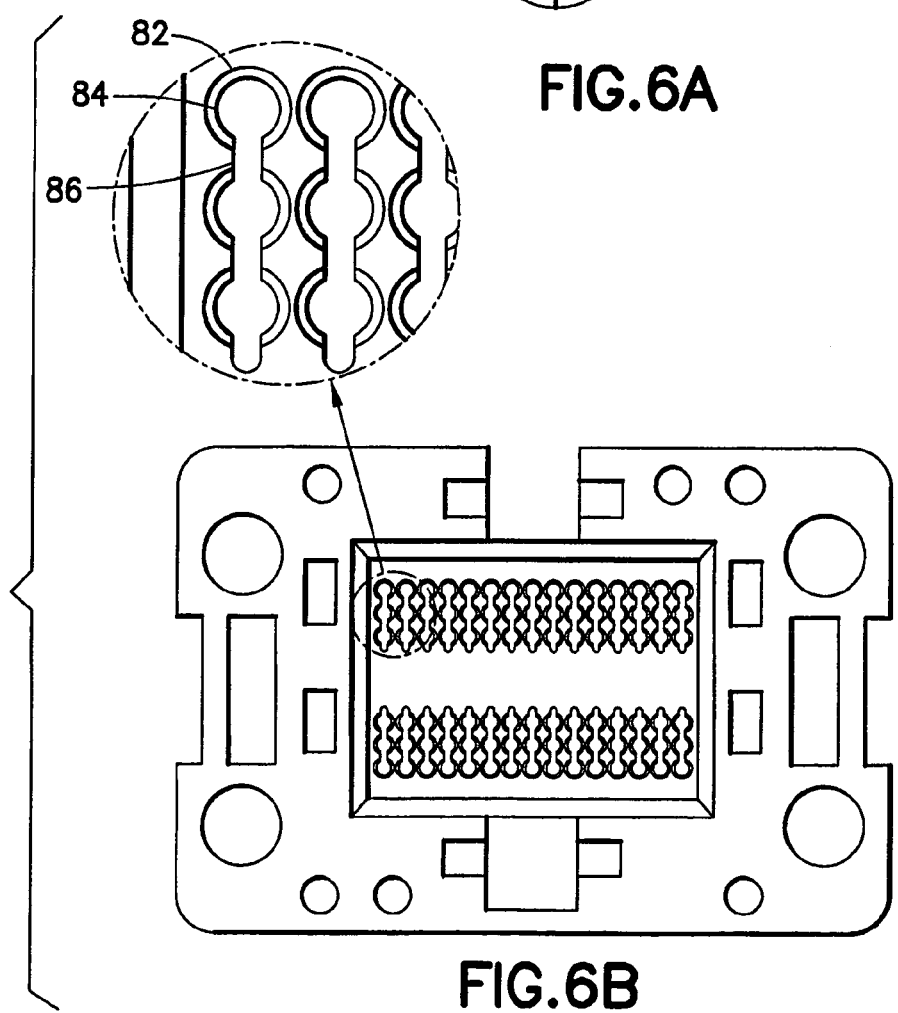
FIG.6A
FIG.6B

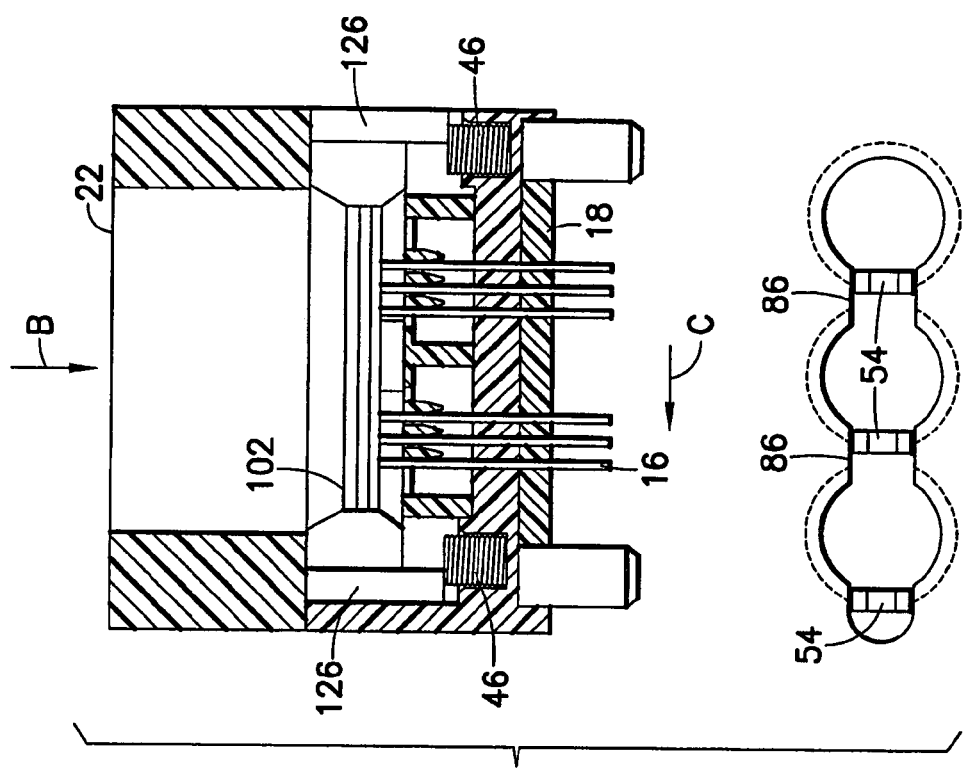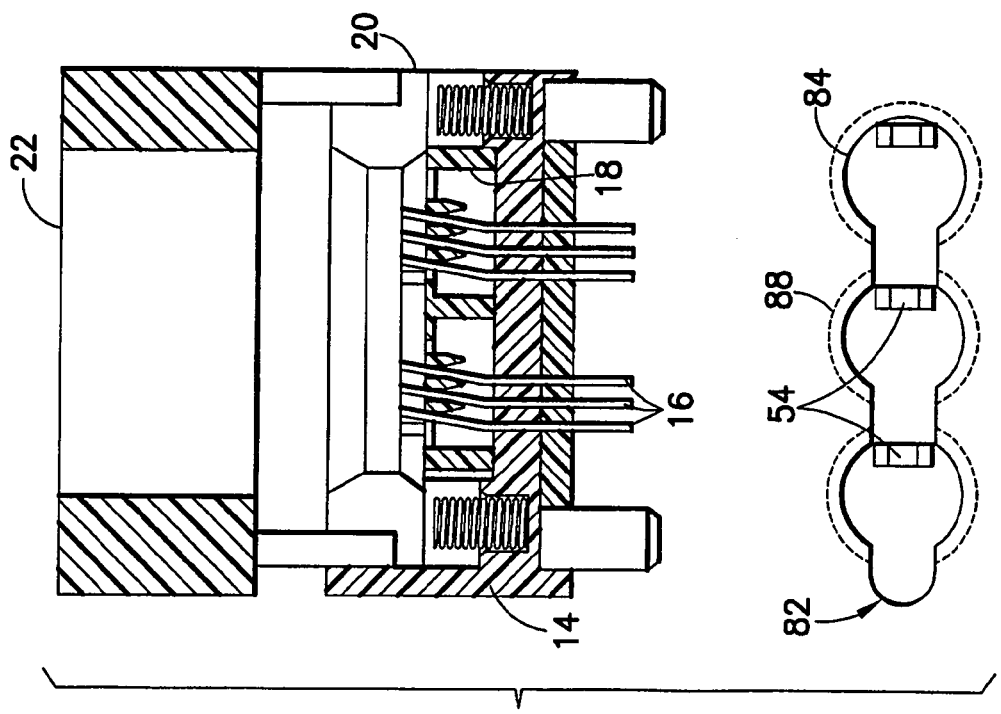

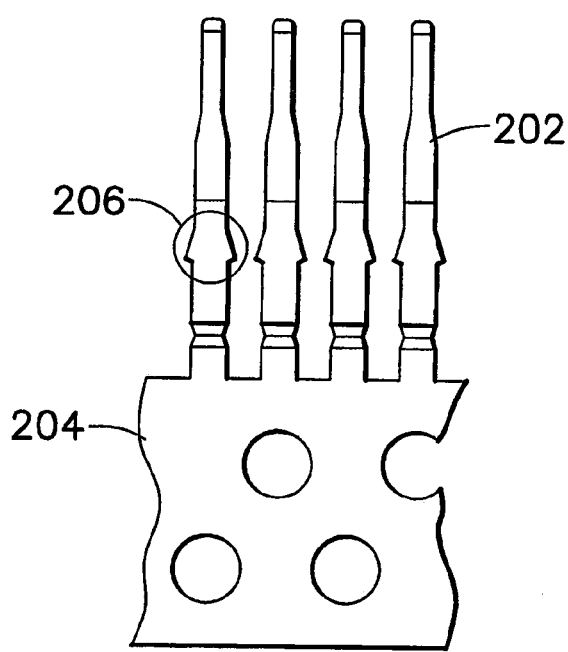
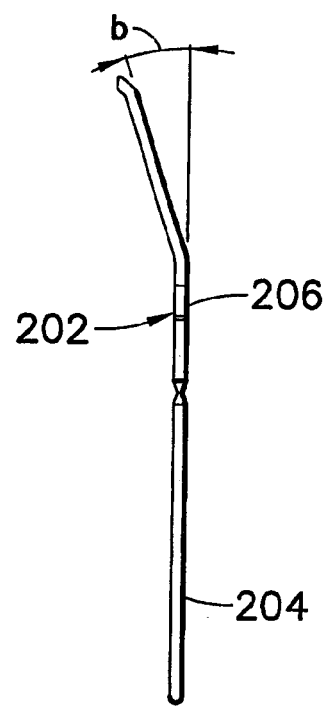
FIG.9A  FIG.9B
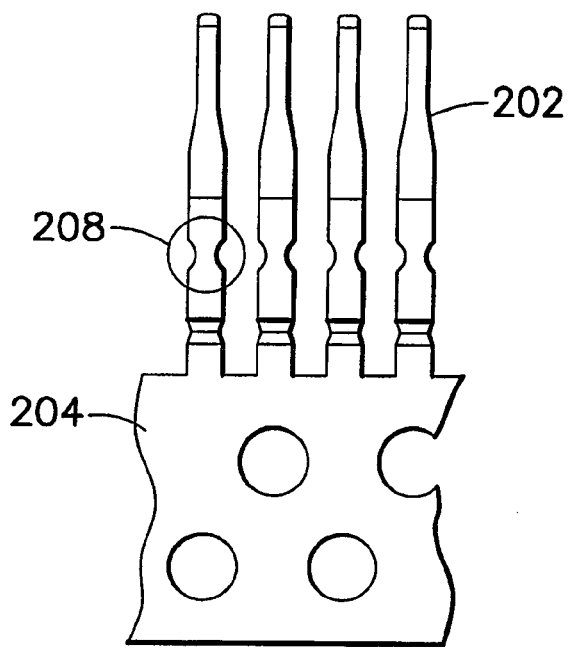
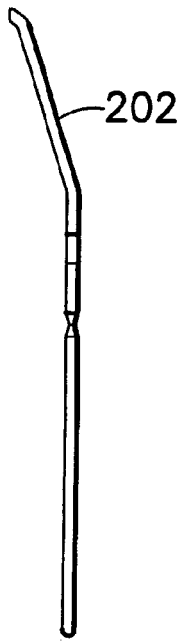
FIG.10A  FIG.10B

TOP LOADED BURN-IN SOCKET

PRIORITY

This application claims priority to an application entitled "TOP LOADED BURN-IN SOCKET" filed in the United States Patent and Trademark Office on Aug. 27, 2004 and assigned U.S. Ser. No. 60/605,321, the contents of which are hereby incorporated by reference.

BACKGROUND

1. Field

The present disclosure relates to a universal burn-in ball grid array socket, and more particularly, a top loaded burn-in socket which eliminates the need for hold down devices when the ball grid array package is inserted into the subject socket.

2. Description of the Related Art

Integrated circuits are typically housed within a package which is designed to protect the integrated circuit from damage, provide adequate heat dissipation during operation, and provide electrical connection between the integrated circuit and the leads of a printed circuit board. Several conventional packages are in the prior art including land grid array (LGA), pin grid array (PGA), ball grid array (BGA), column grid array (CGA) and quad flat pack (QFP).

Referring to FIG. 1A, a ball grid array (BGA) package 102 typically consists of a semi-conductor device 104 and a plurality of conductive ball leads 106 extending downwardly from the bottom surface 108 of the semi-conductor device 104. The BGAs generally place conductive ball leads over an entire surface of a chip, instead of just around the edges. Thus, BGA packages allow system designers to place more leads in a given package size using looser tolerances than peripheral lead type packages such as the quad flat pack (QFP). Therefore, board producers are not required to use the fine pitch spacings that are now necessary for high lead count packages. Also, BGAs have finer pitch spacings than pin grid arrays (PGA), since the solder balls do not have the coplanarality problem associated with through-hole PGAs.

In the prior art, the electrical connection between the BGA package and underlying printed circuit board (PCB), or electrical component, was generally provided by soldering the ball leads which are located underneath the BGA package onto pads which are provided on the upper surface of printed circuit boards.

In many applications, the soldering of the ball leads of the ball grid array package to the printed circuit board is undesirable. For example, it is impossible to visually locate a short or ground between the ball grid array package and printed circuit board. Usually, an expensive X-ray technique is required to inspect the connections since the ball leads are hidden under the ball grid array package. Further, the increasing number of ball leads being provided by ball grid array packages makes the soldering of the ball grid array packages to printed circuit boards more difficult.

Accordingly, in the prior art and disclosed in various patent publications, connectors have been developed which are designed to eliminate the need for the soldering the ball leads of a BGA package to a printed circuit board. More particularly, applicant is the inventor of U.S. Pat. No. 5,887,344 entitled "Method of Mounting a Plurality of Ball Leads onto a BGA Socket" which issued on Mar. 30, 1999 and is assigned to the assignee of the subject patent application. Applicant is also the inventor of U.S. Pat. No. 5,730,606 which issued on Mar. 24, 1998 and is entitled "Universal Production Ball Grid Array Socket". U.S. Pat. No. 5,887,344 is a divisional application of U.S. Pat. No. 5,730,606. In turn, applicant is also the inventor of U.S. Pat. No. 5,984,694 which issued on Nov. 16, 1999 and is entitled "Universal Production Ball Grid Array Socket", and said patent is a divisional application of U.S. Pat. No. 5,887,344. Applicant is also the inventor of U.S. Pat. No. 6,045,416 which issued on Apr. 4, 2000 and is entitled "Universal Production Ball Grid Array Socket", and this patent is a continuation-in-part of U.S. Pat. No. 5,730,606. All of the above-mentioned patents are assigned to the assignee of the subject patent application. U.S. Pat. Nos. 5,730,606; 5,887,344; 5,984,694 and 6,045,416 are all incorporated herein by reference.

One of the possible shortcomings associated with prior art burn-in sockets is the requirement to have, as part of the socket, a means for holding down the chip scale package (CSP) or ball grid array (BGA) package in the socket, because of the spring forces acting to bias the respective package out of the socket. Such hold down means usually incorporates a plurality of individual pieces, in order to lock the ball grid array package to the socket. The additional locking means adds cost, as well as possible mechanical problems in connection with the mounting of a ball grid array package to a burn-in socket of the prior art type.

One example of a prior art type burn-in socket employs a spring pogo "Z" axis type of contact 110 which pushes up against the solder balls 106 of the BGA package as shown in FIG. 1B. Because of the spring structure of the pogo contact 110, the package 102 requires an opposite and reactive force to maintain contact between the pogo sockets and balls. The reactive force is provided by a hold down means which adds parts and complexity to the socket. Similarly, a spring type contact 112 shown in FIG. 1C results in the same disadvantages.

In another type of device as illustrated in FIG. 1D, stamped pins 114 are provided in the socket with a force directed in the "Z" axis direction, and again a hold down means must be provided for maintaining the ball grid array package in the burn-in socket of this prior art type.

A still further type of a prior art socket is shown in FIG. 1E. This type of socket uses dual pinch pins 116, and that type of contact also requires a hold down mechanism that adds parts and complexity to the burn-in socket. Furthermore, since the pinch pins engage a lower portion of the solder balls 106, damage may result to the solder balls.

Furthermore, another one of the possible shortcomings associated with prior art CSP/BGA production sockets is the possible wicking of the fluid materials used during the bonding of the ball leads onto an underside of a ball grid array socket. More particularly, it is important that the contact which extends through a hole in the substrate is tightly supported in the hole so as to ensure that no wicking of fluid materials takes place.

Accordingly, it is an object of the present disclosure to provide a top loaded, burn-in socket which does not require a hold down mechanism as part of the socket.

It is a further object of the present disclosure to provide a top loaded, burn-in socket which inherently includes structure for maintaining the interengagement of the ball grid array package in the burn-in socket, and thereby obviates the requirement for a hold down mechanism as part of the socket.

It is still a further object of the present disclosure to provide a top loaded, burn-in socket which does not require a hold down mechanism as part thereof, thereby eliminating unnecessary structural components within the burn-in socket and reducing the complexity of the socket structure.

It is another object of the present disclosure to provide a contact for a CSP/BGA production socket which is mounted to the socket in a manner to prevent wicking of fluid materials used for bonding a solder ball to the socket.

SUMMARY

A top loaded burn-in socket assembly for forming a plurality of electrical connections between a ball grid array (BGA) package having a plurality of conductive ball leads and an electrical component is provided. The socket assembly includes a plurality of resilient electrical contacts; a cam being configured to position the contacts from a first position to a second position; a device guide plate including a plurality of openings for receiving the ball leads; and an actuating mechanism configured to interact with the cam to position the contacts, wherein an upper portion of the contacts engages the ball leads between the upper portion and an inclined surface of the device guide plate openings. Each ball is thus held in a manner that does not require the use of a hold down mechanism for effecting electrical continuity between the BGA package and the contacts of the subject burn-in socket.

According to one aspect of the present disclosure, a socket assembly includes a generally rectangular housing including a base having a plurality of apertures; a plurality of resilient electrical contacts disposed in the plurality of apertures; a cam having a plurality of openings corresponding to the plurality of contacts disposed in the housing, the cam being configured to position the plurality of electrical contacts from a first closed position to a second open position; a generally rectangular device guide plate disposed on the an upper surface of the housing, the device guide plate having a base including a plurality of openings for receiving the ball leads and a plurality of side walls extending upwardly from the base defining an insert area for the package; and an actuating mechanism configured to interact with the cam to position the plurality of electrical contacts from the first closed position to the second open position.

In another aspect, each electrical contact includes a lower portion for contacting the electrical component below the socket assembly, an intermediate portion for securing the electrical contact to the housing and an upper portion for contacting a ball lead of the package, wherein the upper portion of the electrical contact includes a dual pin configuration for contacting an upper hemisphere of the ball lead.

In a further aspect, the housing of the socket assembly includes a plurality of side walls extending upwardly from the base defining a second insert area for the cam and the cam being dimensioned to be smaller than the second insert area to allow the cam to slide within the second insert area from a first position to a second position. The upper portion of the electrical contact is bent relative to the intermediate portion to bias the cam in the first position. Furthermore, the cam includes a plurality of inclined walls extending downward from a top surface of the cam to guide the upper portion of the electrical contact from the first closed position to the second open position.

In another aspect of the present disclosure, each opening of the device guide plate includes a circular inclined surface that tapers outward from an upper surface of the base of the device guide plate to a lower surface of the base of the device guide plate, wherein the upper portion of the electrical contact extends into the opening of the device guide plate to engage the ball lead between the upper portion and the inclined surface.

In a further aspect, at least three openings of the device guide plate are formed in a key lock configuration, the key lock configuration including a circular opening portion for each of the three openings for receiving a ball lead and a connector portion between at least two of the circular opening portions to allow the upper portion of the electrical contact open wide enough to allow the ball lead to enter the circular opening portion.

According to another aspect of the present disclosure, an electrical contact for a test socket assembly, the test socket assembly for forming a plurality of electrical connections between a ball grid array package having a plurality of conductive ball leads and an electrical component, includes a lower portion for contacting the electrical component below the socket assembly, an intermediate portion for securing the electrical contact to the socket assembly and an upper portion for contacting a ball lead of the package, wherein the upper portion is movable from a first closed position to a second open position.

Furthermore, each contact has molded thereon at one end, preferably by an insert molding technique, a plastic sleeve, which sleeve is of a diameter slightly greater than the diameter of the aperture in the housing to achieve an interference fit for maintaining the contact within the aperture, in a manner which prevents wicking of fluid materials into the contact.

BRIEF DESCRIPTION OF THE DRAWINGS

The above and other aspects, features, and advantages of the present disclosure will become more apparent in light of the following detailed description when taken in conjunction with the accompanying drawings in which:

FIG. 6A is a perspective view of a device guide plate;

FIG. 6B is a top plane view of the device guide plate with an enlarged view of openings formed therein;

FIGS. 8A, 8B, 8C and 8D are cross-sectional views of the socket and corresponding top plan views illustrating the sequential positions of the dual contact pins relative to the side walls of the device guide plate of the present disclosure, where FIG. 8A shows the contacts in a normally closed position, FIG. 8B shows the contacts in an open position, FIG. 8C shows the contact in the open position with the BGA device inserted into the socket, and FIG. 8D shows the contacts in contact with the solder ball leads of the BGA device;

FIG. 9A is a front elevational view of an electrical contact and FIG. 9B is a side elevational view of the contact in FIG. 9A formed for use in the housing according to another embodiment of the present disclosure;

FIG. 10A is a front elevational view of an electrical contact and FIG. 10B is a side elevational view of the contact in FIG. 10A formed for use in the housing according to a further embodiment of the present disclosure;

DETAILED DESCRIPTION

Preferred embodiments of the present disclosure will be described hereinbelow with reference to the accompanying drawings. In the following description, well-known functions or constructions are not described in detail to avoid obscuring the present disclosure in unnecessary detail.

The new and improved top loaded burn-in socket of the present disclosure is intended for use in a chip scale package or ball grid array package (CSP/BGA) burn-in sockets.

Figure 1A:
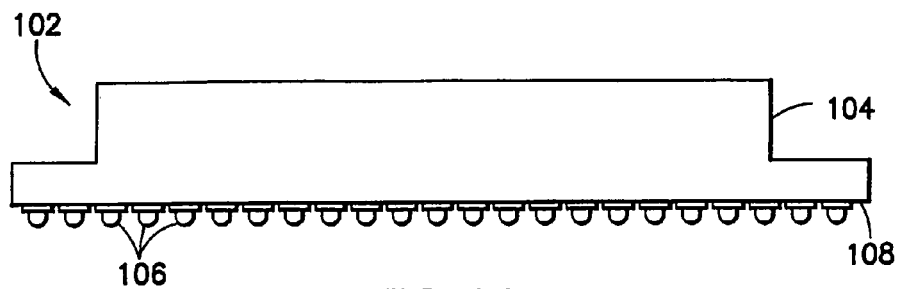
FIG. 1A is a cross sectional view of a conventional ball grid array (BGA) device.
Figure 1B:
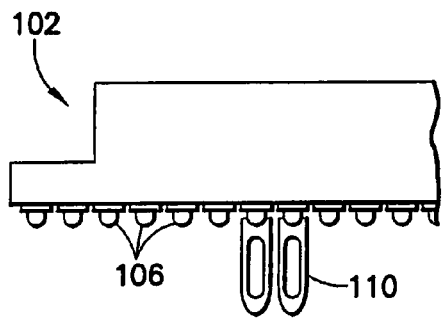
FIGS. 1B, 1B, 1D and 1E illustrate four different types of prior art, burn-in sockets which use different types of contacts.
Figure 1C:
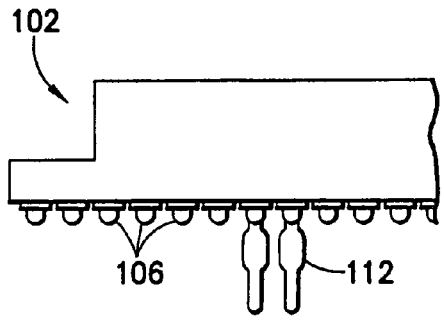
Figure 1D:
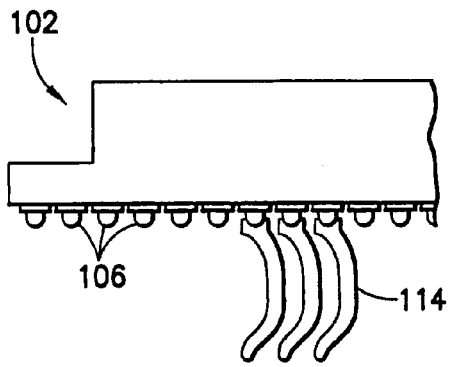
Figure 1E:
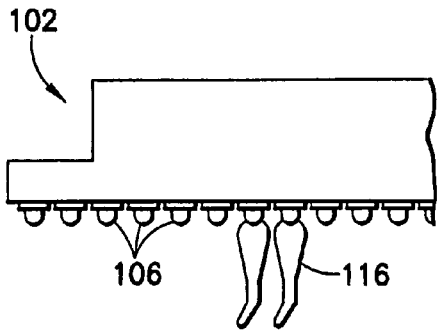
Figure 2:
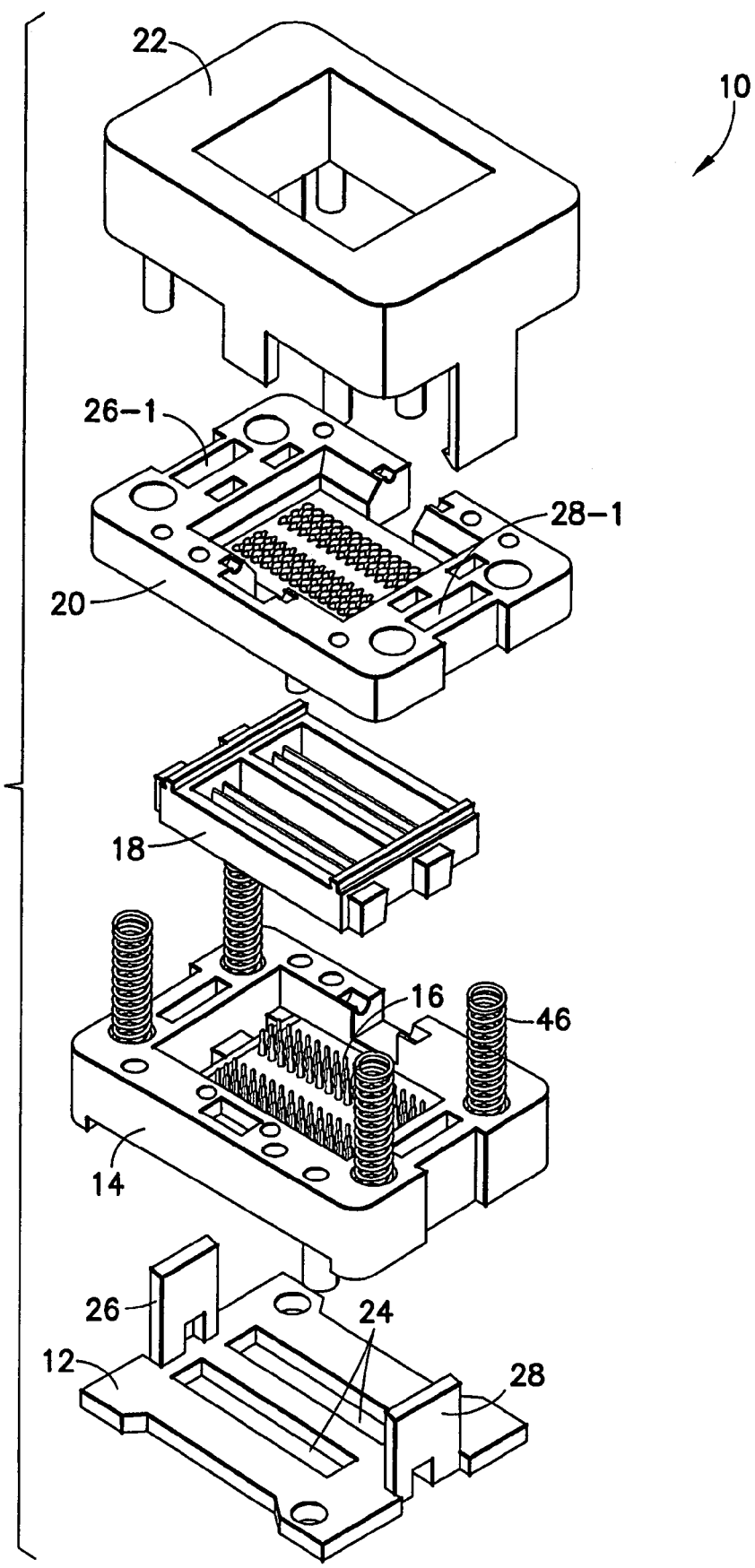
FIG. 2 is an exploded perspective view of the top loaded, burn-in socket of the present disclosure.

Referring to FIG. 2, a top loaded, burn-in socket of the present disclosure is generally designated by the numeral 10. The socket 10 includes a base plate or bottom 12 having openings 24 for coupling the socket to a printed circuit board (PCB), an electrical component or the like, a generally rectangular housing 14 having a plurality of apertures, a plurality of resilient electrical contacts 16 disposed in the plurality of apertures and a cam 18 having a plurality of openings corresponding to the plurality of contacts 16 disposed in the housing 14, the cam being configured to position the plurality of electrical contacts 16 from a first closed position to a second open position. The socket 10 also includes a generally rectangular device guide plate 20 disposed on an upper surface of the housing 14. The device guide plate 20 includes a base including a plurality of openings for receiving solder ball leads or contacts of an integrated circuit (IC) device and a plurality of side walls extending upwardly from the base defining an insert area for the IC package or device 102. Further, the socket 10 includes an actuating mechanism or cam pusher 22 configured to interact with the cam 18 to position the plurality of electrical contacts 16 from the first closed position to the second open position.

The base plate 12 is formed from a generally flat piece of non-conductive material which in use will be securely fastened to a PCB or the like. The base plate also includes a plurality of apertures for enabling the contacts of the socket 10 to be coupled to corresponding connections of a PCB or the like. The base plate 12 further includes two latches 26, 28 for coupling to corresponding openings 26-1, 28-1 of the device guide plate 20 for containing intermediate components of the socket together.

Figure 3:
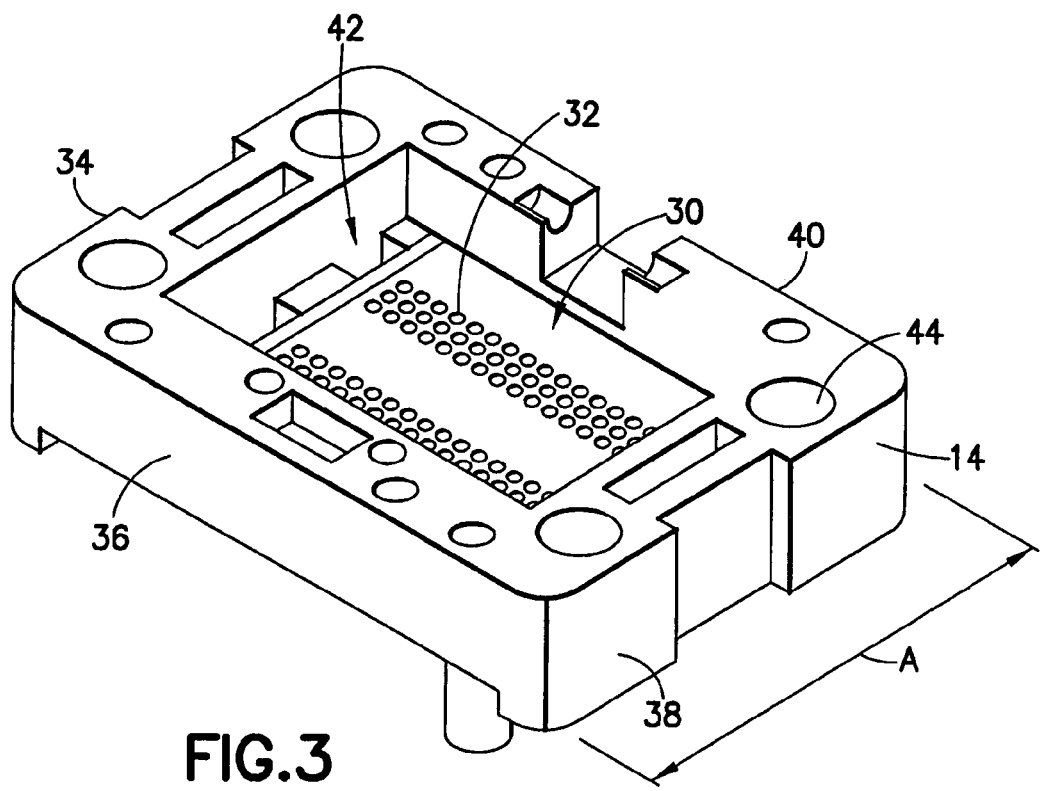
FIG. 3 is a perspective view of a housing employed in the top loaded burn-in socket of the present disclosure.

Referring to FIG. 3, the housing 14 is illustrated without the electrical contacts disposed therein. The non-conductive housing 14 is generally rectangular having a base 30 including a plurality of apertures 32 for receiving the contacts 16 and a plurality of side walls 34, 36, 38, 40 extending upwardly from the base 30 defining an insert area 42 for the cam 18. The housing 14 further includes a plurality of annular recesses 44 for receiving springs 46 which bias the cam pusher 22 in its most upright position.

Figures 4A, 4B, 4C:
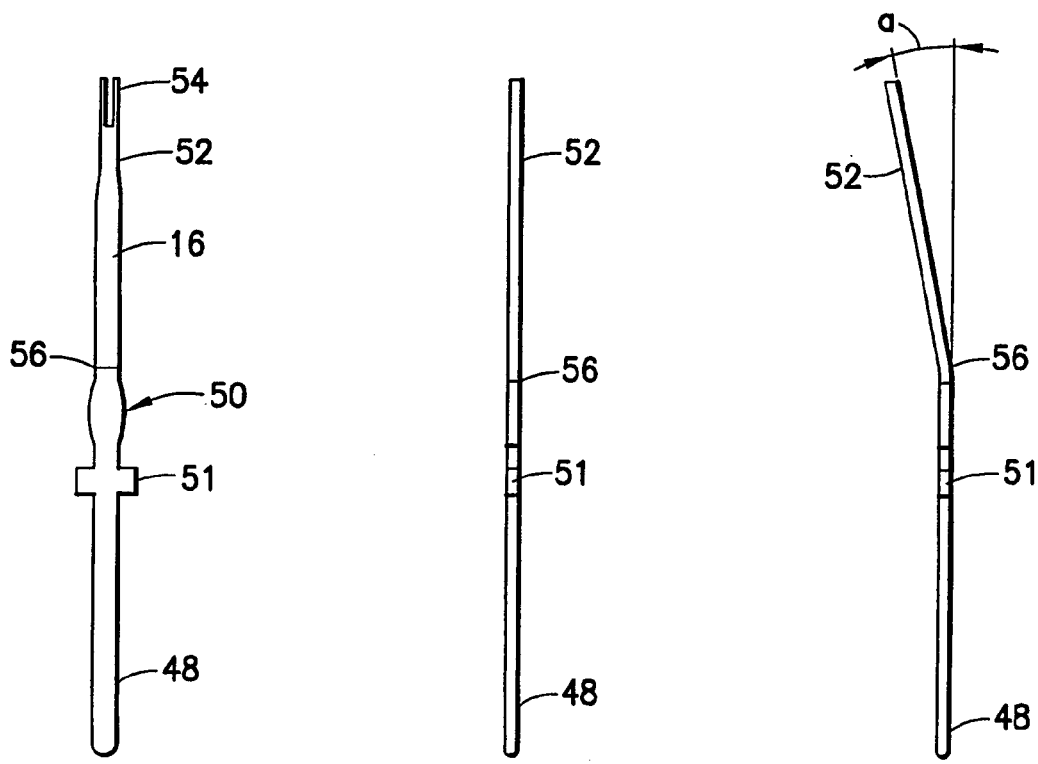
FIG. 4A is a front elevational view of an electrical contact for the socket of the present disclosure.
FIG. 4B is a side elevational view of the contact in FIG. 4A
FIG. 4C is a side elevational view of the contact formed for use in the housing according to an embodiment of the present disclosure.

Referring to FIGS. 4A and 4B, an electrical contact 16 to be employed in the socket 10 of the present disclosure is illustrated. The contact 16 includes a lower portion 48 which extends through the base plate 12 for coupling to an electrical component, underlying PBC or the like, an intermediate portion 50 including a barb 51 and an upper portion 52 for contacting a solder ball lead. The intermediate portion 50 is configured with the barb 51 to form an interference fit when placed in an aperture 32 of the housing 14 to secure the contact 16. The upper portion 52 includes a dual contact pin configuration 54 for contacting an upper hemisphere of a solder ball. Preferably, the contact 16 is stamped from a single piece of sheet material, e.g., a blank, which will add only a small thickness to the openings in the device guide plate for receiving the ball leads.

As shown in FIG. 4C, the upper portion 52 of contact 16 is bent at a deflection point 56 of intermediate portion 50 at a predetermined angle a. The contact 16 may be formed from any known resilient conductive material. Preferably, the contact 16 is made of a brush beryllium copper alloy and has resilient properties which allow the upper portion 52 to move from a first position as shown in FIG. 4C to a second position as shown in FIG. 4B. The resiliency of the contact and the configuration of the device guide plate 20 will enable the socket to retain a BGA device without a hold down mechanism, the details of which will be described below.

Figure 5A:
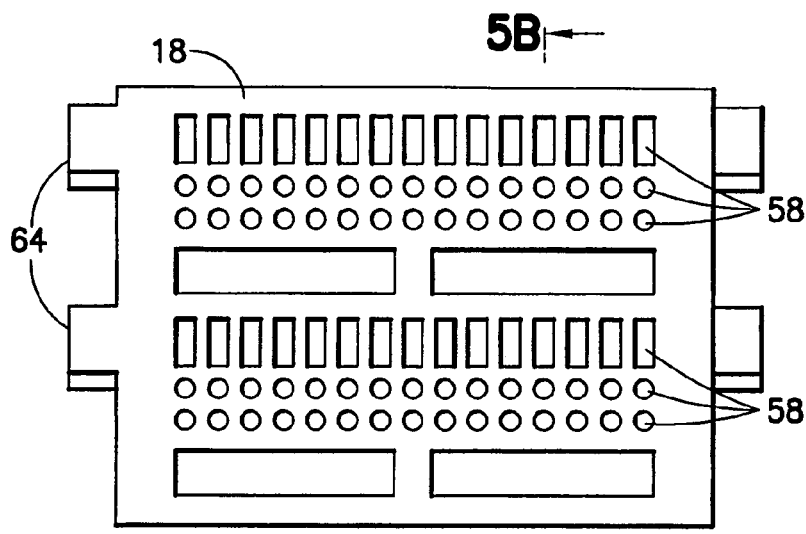
FIG. 5A is a top plan view of a cam employed in the socket of the present disclosure.
Figure 5B:
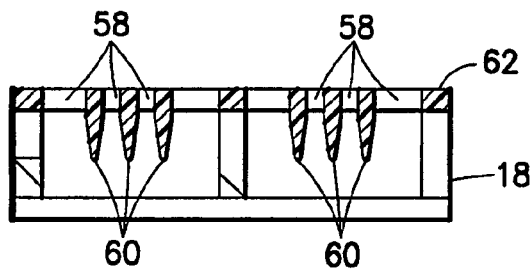
FIG. 5B is a side elevational view of the cam taken along line 5B—5B in FIG. 5A.
Figure 5D:
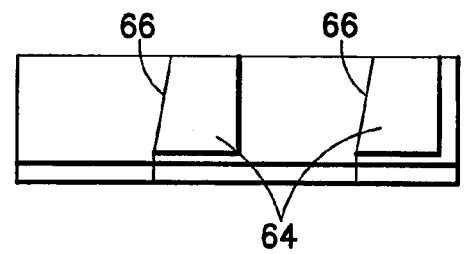
FIG. 5C is bottom perspective view of the cam and FIG. 5D is a side elevational view of the cam.
Figure 5C:
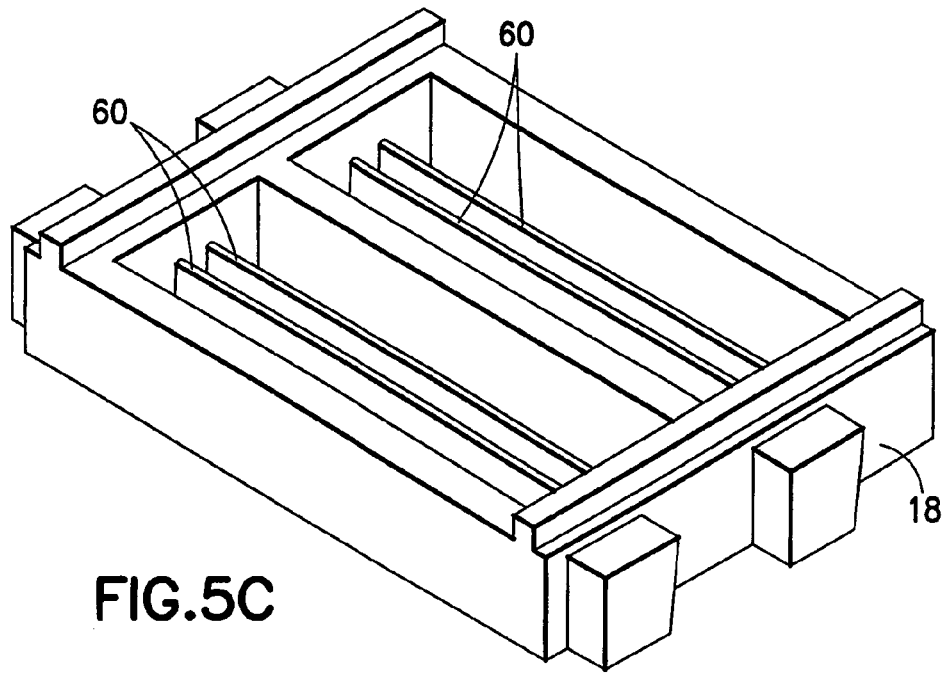

A top plan view of the cam 18 is shown in FIG. 5A. The cam 18 is formed from a non-conductive material and is generally rectangular and includes a plurality of openings 58 the number of which corresponds to the number of contacts 16. The cam 18 is dimensioned to be smaller than the insert area 42 of the housing 14 so when disposed in the insert area 42 the cam 18 will be allowed to slide back and forth as indicated by arrow A shown in FIG. 3. The sliding motion of the cam 18 will move the upper portion 52 of the contact 16 from a first, closed position to a second, open position. Referring to FIGS. 5B and 5C, a plurality of inclined walls 60 extend downwardly from a top surface 62 of the cam 18 to guide the upper portion 52 of each contact 16. Each wall 60 is placed between the rows of openings 58 to allow the contacts 16 to transition smoothly from the first position to the second position.

The cam 18 further includes a plurality of actuation members 64 configured with at least one inclined surface 66. As will be described below, the cam pusher 22 will interact with the actuation members 66 to actuate, or slide, the cam, and the contacts, from its first position to a second position. The resilient nature of the contacts will bias the cam 18 to slide back to the first position when pressure is removed from the cam pusher 22.

Figure 6C:
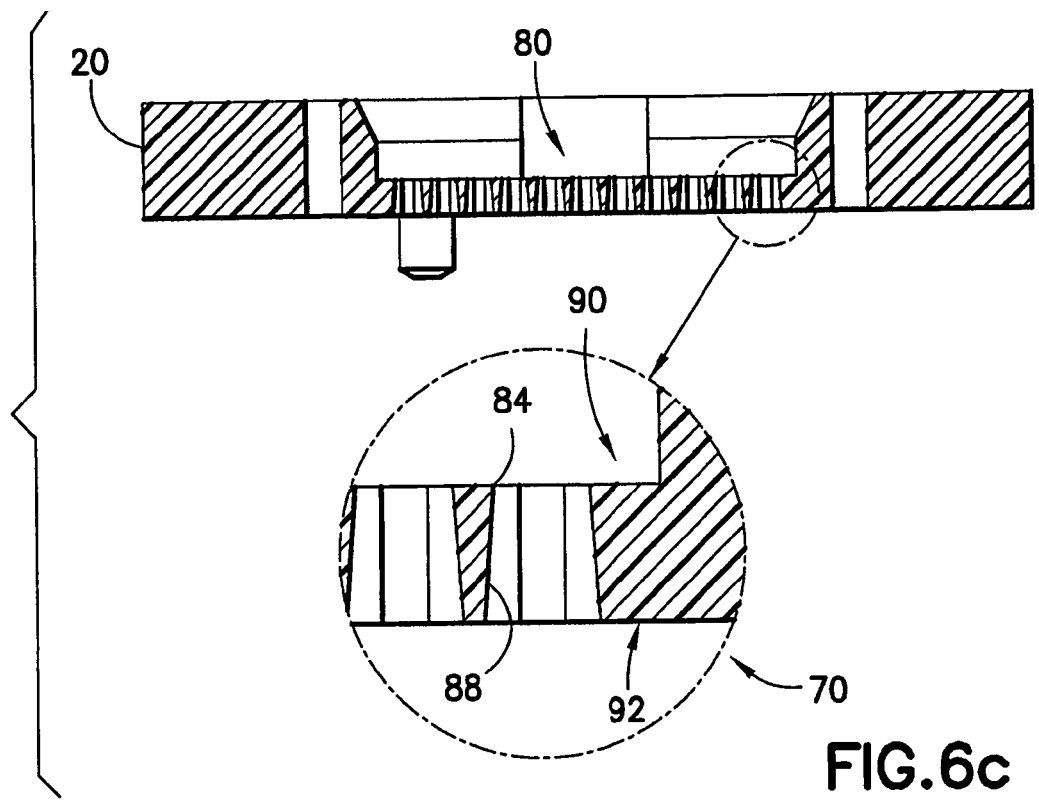
FIG. 6C is a cross-sectional view of the device guide plate with an enlarged view of one opening of the device guide plate.

Referring now to FIG. 6A, a perspective view of the device guide plate 20 is illustrated. The non-conductive device guide plate 20 is generally rectangular device and has a base 68 including a plurality of opening 70 for receiving solder ball leads or contacts 106 of a BGA device 102 and a plurality of side walls 72, 74, 76, 78 extending upwardly from the base 68 defining an insert area 80 for the IC device or package 102. Each group of three openings 70 is formed in a key lock configuration 82 as shown in the enlarged view of FIG. 6B. Referring to FIG. 6C, each key lock configuration 82 includes a circular opening portion 84 for receiving a solder ball contact 106 and a connector portion 86 to allow the upper portion 52 of the electrical contact 16 to open wide enough to allow the solder ball to enter the opening 84. Each opening 70 includes a circular inclined surface 88 that tapers outward from an upper surface 90 of the base to a lower surface 92 of the base 68. The operation of the upper portion 52 of the electrical contact 16 and the key lock configuration 82 will be described in more detail below in relation to FIG. 8.

Figure 7:
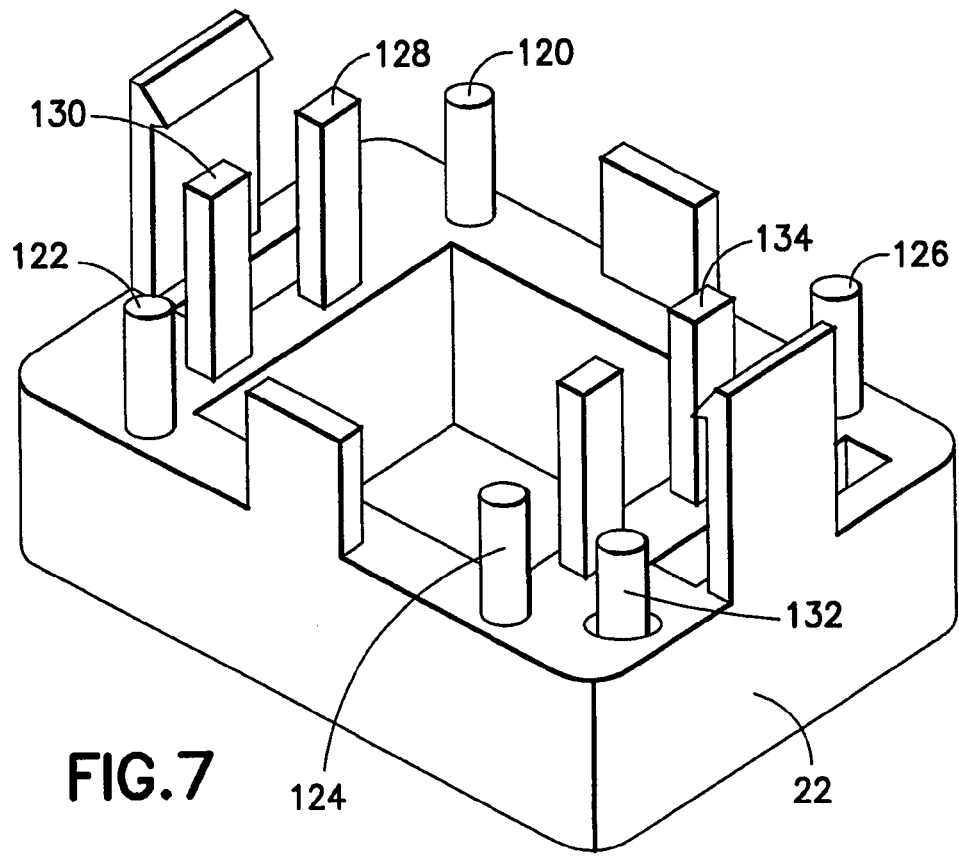
FIG. 7 is a bottom perspective view of an actuating mechanism.

The actuating mechanism or cam pusher 22 is illustrated in FIG. 7. The actuating mechanism 22 is formed from a non-conductive material and is generally rectangular and includes a plurality of members for interacting with other components of the socket 10. Members 120, 122, 124, 126 interact with the plurality of springs 46 recessed in the housing and cause the cam pusher 22 to be biased in its most upright position. Members 128, 130, 132, 134 interact with the actuation members 64 of the cam 18 to slide the cam 18 to the second position to open the contacts 16. In the second position, the upper portion 52 of the contact 16 is in line with the intermediate portion 50 and lower portion 48.

Referring to FIG. 8A, when the top loaded, burn-in socket 10 is in its initial or rest position, the cam pusher 22 is biased to its most upright position and the cam 18 is in the first position, in the figure, to the right. The dual contact pin portion 54 of each contact 16 engages or is very close to the respective circular opening portion 84 of the opening 70 of the device guide plate 20. At this time, the spacing between each contact 16, e.g., the dual contact pin portion 54, and the inclined wall 88 of the opening 70 prevents a solder ball 106 from entering the respective opening 70, and thus, the contact 16 is in the closed position.

As pressure is exerted on the cam pusher 22 in a downward direction as indicated by arrow B, members 120, 122, 124, 126 interact with the plurality of springs 46 and members 128, 130, 132, 134 interact with the actuation members 64 of the cam 18 to slide the cam 18 to the left as indicated by arrow C in FIG. 8B. The movement of the cam 18 causes the upper portion 52 of each contact 16 to bend at the deflection point 56 so as to open the contact 16. In this position, the upper portion 52 of the contact 16 is in line with the intermediate portion 50 and lower portion 48. Here, the upper inclined portion 52 of each contact 16 is sufficiently spaced from the respective inclined wall 88 to create an enlarged opening to allow the solder ball 106 to be received in the opening 70, e.g., an open contact position. The connector portion 86 of the key lock configuration 82 allows the dual pin contact portion 54 of the contact 16 to move to a position so opening 84 is now larger enough to allow entry of a solder ball.

Figure 8D:
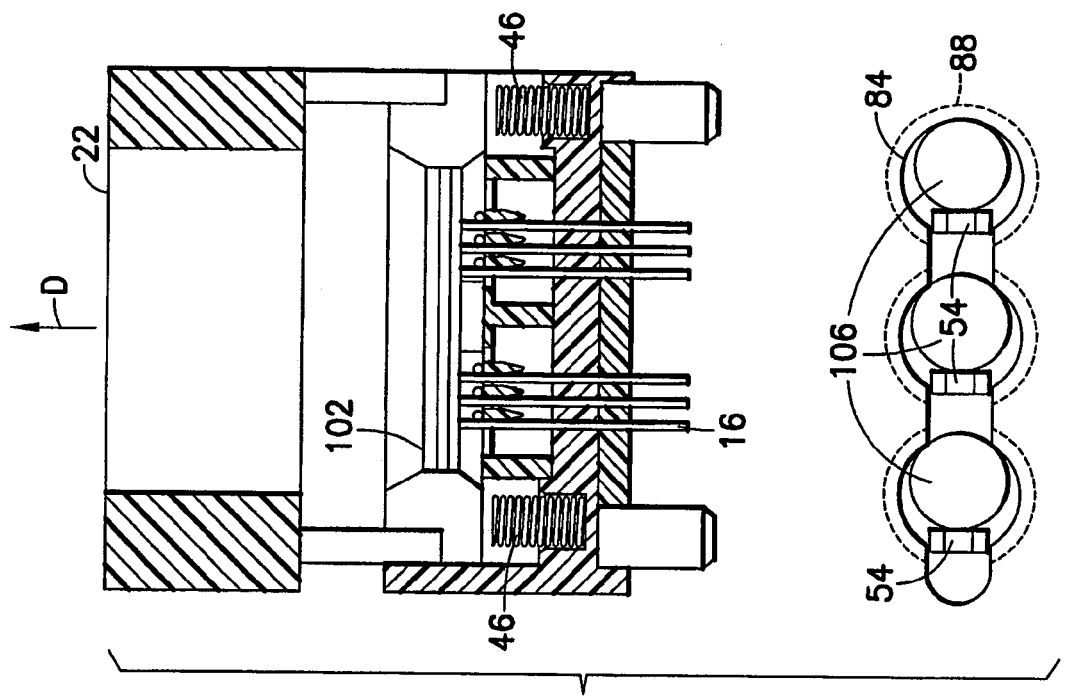
Figure 8C:
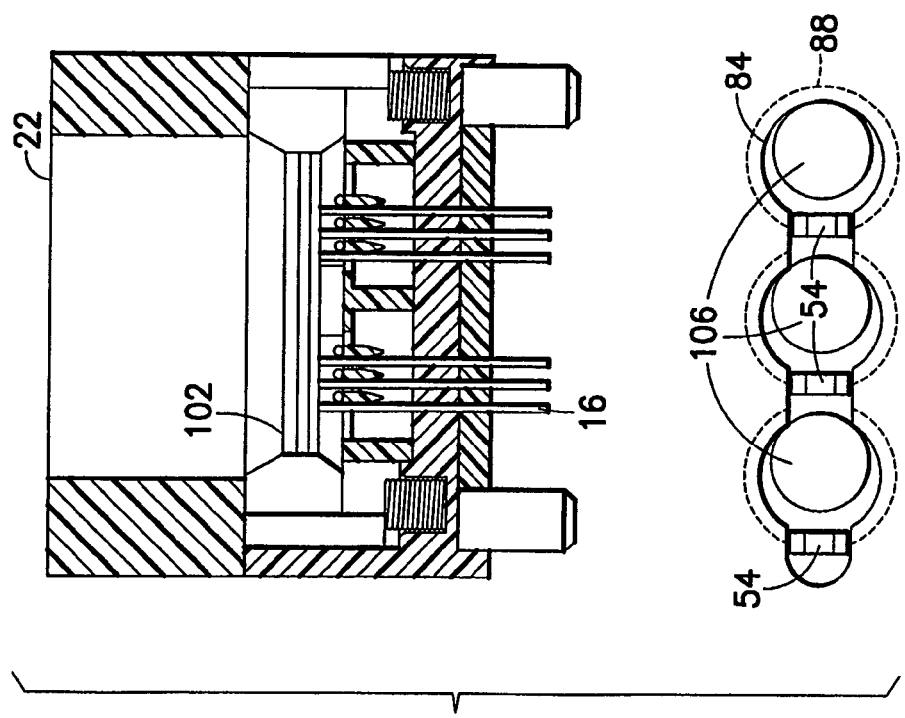

While the downward pressure is maintained on the cam pusher 22, an IC device or package 102 may now be inserted into the socket 10 as shown in FIG. 8C. Here, the solder balls 106 of the IC device 102 are in the openings 70 but the dual pin contact portion 54 in not yet in contact with the solder balls 106.

After the BGA device 102 is inserted, the pressure is released from the cam pusher 22 and the cam pusher is biased in the direction as indicated by arrow D in FIG. 8D by springs 46. As the cam pusher withdraws, members 128, 130, 132, 134 disengage with actuation members 64 of the cam 64 and the upper portion 52 of the contacts return to their normal or first position driving the cam 18 back to its first position. As the contacts 16 return to their rest position, the dual contact pin portion 54 engages the solder ball 106 on one side while the solder ball comes into contact with the inclined wall 88 of opening 70 of the device guide plate 20, thereby positively engaging and holding the solder ball 106 within the top loaded, burn-in socket 10 and establishing good electrical contact between the ball grid array package 102 and the top loaded, burn-in socket 10.

After the ball grid array package 102 is loaded into the top loaded, burn-in socket 10, the dual contact pin 54 of each contact 16 engages the upper hemispherical surface of the respective solder ball 106, and at the same time the inclined wall surface 88 likewise engages the upper hemispherical surface of the ball 106, thereby restraining movement of the ball 106 from the opening 70, and thereby effectively locking the ball grid array package 102 within the top loaded, burn-in socket 10.

Because of the interengagement of the solder balls 106 with the contacts 16 and the inclined surfaces 88 of the device guide plate 20, there is no need for a hold down mechanism to form a part of the top loaded, burn-in socket 10, thereby reducing the number of parts of the socket 10 as well as reducing the complexity of the structure of the socket 10. Furthermore, since the socket 10 adds thickness only to one side of a solder ball via a single contact, the top loaded burn-in socket of the present disclosure is scaleable from 0.5 mm to 1.27 mm. This results in a very low cost socket since the contact is blanked out from sheet material and has only one simple forming station.

FIGS. 9A and 9B illustrate another embodiment of an electrical contact 202 to be employed in the socket 10 in accordance with the present disclosure. In the embodiment as shown in FIG. 9A, the contacts 202 are still connected to a carrier strip 204, and the contacts are made of a brush beryllium copper alloy or similar conductive material as in known in the art. In the embodiments of FIGS. 9A and 9B, each contact 202 includes an intermediate barb 206 for connection to the socket structure, e.g., housing 14. In FIG. 9B, the contacts 202 are formed so as to be bent through an angle b, e.g., approximately nineteen degrees, prior to the step of molding a plastic sleeves to the contacts, as will be described below.

In the embodiments of FIGS. 10A and 10B, the barbed portion 206 is replaced with an undercut 208 as required in certain applications.

Figure 11A:
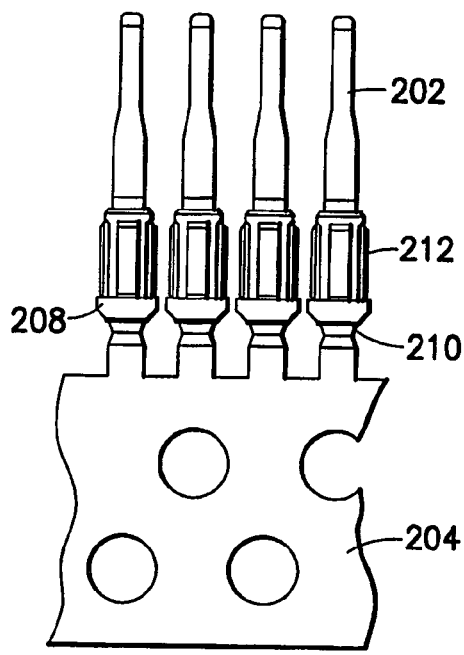
FIGS. 11A and 11B are respectively front elevational and side elevational views of a socket contact of the present disclosure, with a plastic sleeve molded thereon, and with the contact being formed and still connected to a carrier strip.
Figure 11B:
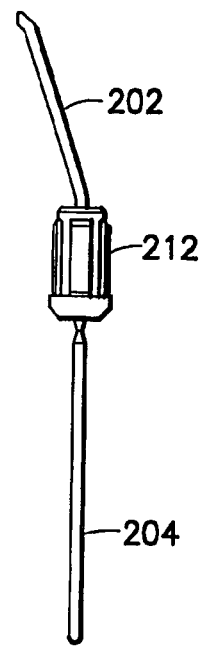
Figure 11C:
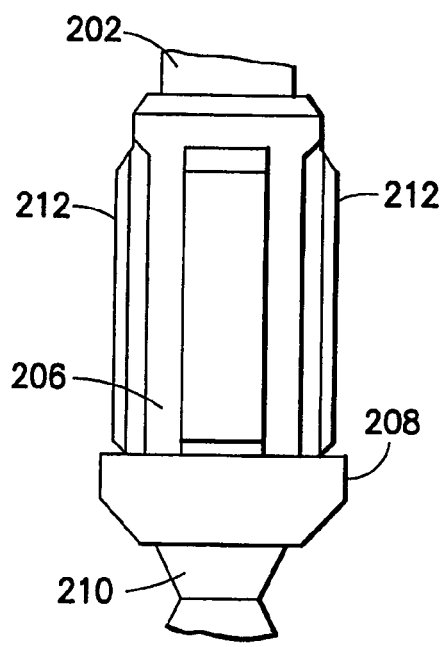
FIG. 11C is a front elevational view of the plastic sleeve.

FIGS. 11A and 11B respectively illustrate a front elevational view and a side elevational view of the contacts 202 with molded sleeves 206 as attached to the carrier 204. As shown in FIGS. 11A–11C, insert molded about one end of each contact 202 is a plastic sleeve 206 including a flat platform portion 208 such that a portion 210 of the contact extends beyond the platform portion 208. After the plastic sleeves 206 are insert molded about the contacts 202, the carrier strip 204 may then be broken off from the array of contacts 202.

Figure 11D:
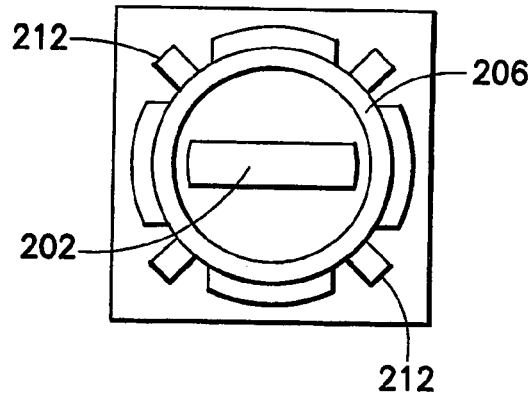
FIG. 11D is a top elevational view of FIG. 11C.
Figure 11E:
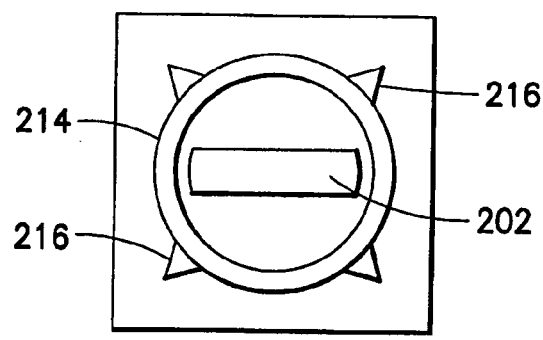
FIG. 11E is a top plan view of an alternate configuration of the plastic sleeve.

FIGS. 11C and 11D illustrate one embodiment of the plastic sleeve members 208 which include fins designated by the numerals 212 which assist in achieving a tight interference fit between the sleeve 206 and the opening in the socket, so as to prevent wicking of fluid materials when a socket ball is attached to the end 210 of the contact 202. FIG. 11E illustrates another embodiment of the molded sleeve 214 which is generally circular with extending triangular fins 216.

The process by which socket balls may be attached to the bottom portion 210 of contacts 202 is fully disclosed in the above-mentioned patents of the applicant, and which are assigned to the assignee of the present disclosure.

While the disclosure has been shown and described with reference to certain preferred embodiments thereof, it will be understood by those skilled in the art that various changes in form and detail may be made therein without departing from the spirit and scope of the disclosure as defined by the appended claims.

What is claimed is:

1. A socket assembly for forming a plurality of electrical connections between a ball grid array package having a plurality of conductive ball leads and an electrical component, the socket assembly comprising:
   a generally rectangular housing including a base having a plurality of apertures;
   a plurality of resilient electrical contacts disposed in the plurality of apertures, each electrical contact includes a lower portion for contacting the electrical component below the socket assembly, an intermediate portion for securing the electrical contact to the housing and an upper portion for contacting a ball lead of the package, each electrical contact includes a sleeve molded around the intermediate portion for forming an interference fit between the sleeve and at least one of the plurality of apertures of the housing;
   a cam having a plurality of openings corresponding to the plurality of contacts disposed in the housing, the cam being configured to position the plurality of electrical contacts from a first closed position to a second open position;
   a generally rectangular device guide plate disposed on an upper surface of the housing, the device guide plate having a base including a plurality of openings for receiving the ball leads and a plurality of side walls extending upwardly from the base defining an insert area for the package; and
   an actuating mechanism configured to interact with the cam to position the plurality of electrical contacts from the first closed position to the second open position.

2. The socket assembly of claim 1, wherein the upper portion of the electrical contact includes a dual pin configuration for contacting an upper hemisphere of the ball lead.

3. The socket assembly of claim 1, wherein the electrical contact is made from a beryllium copper alloy.

4. The socket assembly of claim 1, wherein the sleeve includes at least one fin.

5. The socket assembly of claim 1, wherein the housing includes a plurality of side walls extending upwardly from the base defining a second insert area for the cam and the cam being dimensioned to be smaller than the second insert area to allow the cam to slide within the second insert area from a first position to a second position.

6. The socket assembly of claim 5, wherein the upper portion of the electrical contact is bent relative to the intermediate portion to bias the cam in the first position.

7. The socket assembly of claim 6, wherein the cam includes a plurality of inclined walls extending downward from a top surface of the cam to guide the upper portion of the electrical contact from the first closed position to the second open position.

8. A socket assembly for forming a plurality of electrical connections between a ball gird array packaae having a plurality of conductive ball leads and an electrical component, the socket assembly comprising:
   a generally rectangular housing including a base having a plurality of apertures;
   a plurality of resilient electrical contacts disposed in the plurality of apertures, each electrical contact includes a lower portion for contacting the electrical component below the socket assembly, an intermediate portion for securing the electrical contact to the housing and an upper portion for contacting a ball lead of the package;
   a cam having a plurality of openings corresponding to the plurality of contacts disposed in the housing, the cam being configured to position the plurality of electrical contacts from a first closed position to a second open position;
   a generally rectangular device guide plate disposed on an upper surface of the housing, the device guide plate having a base including a plurality of openings for receiving the ball leads and a plurality of side walls extending upwardly from the base defining an insert area for the package, each opening of the device guide plate includes a circular inclined surface that tapers outward from an upper surface of the base of the device guide plate to a lower surface of the base of the device guide plate; and
   an actuating mechanism configured to interact with the cam to position the plurality of electrical contacts from the first closed position to the second open position.

9. The socket assembly of claim 8, wherein the upper portion of the electrical contact extends into the opening of the device guide plate to engage the ball lead between the upper portion and the inclined surface.

10. The socket assembly of claim 9, wherein at least three openings of the device guide plate are formed in a key lock configuration, the key lock configuration including a circular opening portion for each of the three openings for receiving a ball lead and a connector portion between at least two of the circular opening portions to allow the upper portion of the electrical contact open wide enough to allow the ball lead to enter the circular opening portion.

* * * * *